(12) United States Patent
Chung et al.

(10) Patent No.: US 6,677,662 B1
(45) Date of Patent: Jan. 13, 2004

(54) CLAMP AND HEAT BLOCK ASSEMBLY FOR WIRE BONDING A SEMICONDUCTOR PACKAGE ASSEMBLY

(75) Inventors: Young Suk Chung, Seoul (KR); Soo Jung Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,487

(22) Filed: Oct. 13, 2000

(Under 37 CFR 1.47)

(30) Foreign Application Priority Data

Oct. 15, 1999 (KR) .......................... 1999-44661

(51) Int. Cl.[7] .................. H01L 23/495; H01L 23/34
(52) U.S. Cl. .................. 257/666; 257/718; 257/675; 257/722
(58) Field of Search ...................... 257/718, 722, 257/670, 711, 675

(56) References Cited

U.S. PATENT DOCUMENTS

| 4,530,152 A | 7/1985 | Roche et al. ............ 29/588 |
| 5,041,902 A | 8/1991 | McShane .............. 357/79 |
| 5,157,480 A | 10/1992 | McShane et al. ........ 357/74 |
| 5,172,213 A | 12/1992 | Zimmerman ............ 257/796 |

(List continued on next page.)

FOREIGN PATENT DOCUMENTS

| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

*Primary Examiner*—Amir Zarabian
*Assistant Examiner*—Kiesha Rose
(74) *Attorney, Agent, or Firm*—Stetina Brunda Garred & Brucker

(57) ABSTRACT

A clamp and heat block assembly for wire bonding a semiconductor package assembly. The package assembly has a semiconductor chip having a plurality of bond pads on an upper surface the chip, a chip paddle secured to a bottom surface of the chip by an adhesive, a plurality of tie bars being connected to corners of the chip paddle and externally extending from the chip paddle, a plurality of leads radially formed at regular intervals along and spaced apart from the chip paddle and extending towards the chip paddle. The package assembly further includes a plurality of conductive wires electrically connected to the leads and the chip. The heat block assembly includes a heat block, a guide block, and a clamp. The guide block has a raised portion for receiving the heat block, which has a groove mating with the raised portion of the guide block. The guide block and heat block are secured to the package assembly by the clamp, which engages the package assembly on an upper surface of the leads. The clamp has a notch adapted to identify a first lead of the package assembly.

11 Claims, 5 Drawing Sheets

U.S. PATENT DOCUMENTS

| | | | |
|---|---|---|---|
| 5,172,214 A | 12/1992 | Casto | 257/676 |
| 5,278,446 A | 1/1994 | Nagaraj et al. | 257/707 |
| 5,428,248 A | 6/1995 | Cha | 257/676 |
| 5,521,429 A | 5/1996 | Aono et al. | 257/676 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,856,911 A * | 1/1999 | Riley | 361/704 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A * | 11/2000 | Glenn | 174/52.4 |
| 6,229,200 B1 | 5/2001 | Mclellan et al. | 257/666 |
| 6,242,281 B1 | 6/2001 | Mclellan et al. | 438/106 |
| 6,294,100 B1 | 9/2001 | Fan et al. | 216/14 |
| 6,355,502 B1 * | 3/2002 | Kang et al. | 438/110 |

* cited by examiner

CLAMP AND HEAT BLOCK ASSEMBLY FOR WIRE BONDING A SEMICONDUCTOR PACKAGE ASSEMBLY

BACKGROUND OF THE INVENTION

1. Field of the Invention

The present invention relates, in general, to wire bonding a semiconductor package and, more particularly but not by way of limitation, to a clamp and a heat block of the wire bonding of a semiconductor package, with which the wire bonding can be easily and safely conducted.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a lead frame as the central supporting structure of such a package. A portion of the lead frame completely surrounded by the plastic encapsulant is internal to the package. Portions of the lead frame extend internally from the package and are then used to connect the package externally. More information relative to lead frame technology may be found in Chapter 8 of the book *Micro Electronics Packaging Handbook*, (1989), edited by R. Tummala and E. Rymaszewski, and incorporated by reference. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. A typical semiconductor package is a leadframe having a plurality of tie bars internally extended from the corners over the frame body, a chip paddle in contact with the tie bars on which a semiconductor chip is later mounted, a plurality of internal leads regularly formed at a distance away from and along the perimeter of the chip paddle, external leads which are extended from the internal leads having terminals being connected to the frame body, and dam bars which are positioned between the internal leads and the external leads connected to the frame body. Half-etched parts are provided to the sides of the chip paddle, to the chip paddle facing the ends of the internal leads, and to the tie bars regions near the chip paddle.

After a semiconductor chip is bonded onto the chip paddle via an adhesive, a clamp is placed on the upper surface of the internal leads in a leadframe and then a heat block guided by a guide block is allowed to underlay the entire bottom surface area of the chip paddle and the internal leads to fix or support the chip paddle, the semiconductor chip and the internal leads. The clamp, in combination with the heat block and guide block, prevents the internal leads from being changed and positioned during a wire bonding process.

Next, an electrical connection is formed with conductive wires, such as gold wires or aluminum wires, between the bond pads of the semiconductor chip and the internal leads of the leadframe. The semiconductor chip, the conductive wires, the chip paddle, the tie bars, and the internal leads are next encapsulated by an encapsulate to form a package body. The half-etched section of the internal leads, being individually unsupported, tend to warp downwardly, causing a bonding defect. This results in a lower production yield.

In addition, a groove in the heat block, which is guided by a protrusion on a guide block, is relatively narrow. The result is a reduction in the supporting area of the guide block and tilting of the leadframe. Thus, the wire bonding process cannot be accurately implemented.

Typically, a mark for indicating the first of a plurality of internal leads is provided. Using this mark, the wire bonding process is conducted with the aid of a predetermined program. However, the mark for indicating the first internal lead is frequently screened by the clamp, thereby making it difficult to conduct the wire bonding process.

BRIEF SUMMARY OF THE INVENTION

In one embodiment of the present invention, there is provided a semiconductor chip having an upper surface and a bottom surface. A plurality of input bond pads and output bond pads on the upper surface of the semiconductor chip and along the circumference of the semiconductor chip are electrically connected to the semiconductor chip.

A leadframe is provided having a plurality of tie bars. Each of the tie bars has a side surface and a bottom surface. The plurality of tie bars are connected to the corners of a chip paddle. The plurality of the tie bars externally extend from the chip paddle and have a half-etched section. A plurality of dam bars are provided on the leadframe to help limit flow of encapsulation material on the leadframe.

A plurality of internal leads connect to the leadframe. Each of the leads has a side surface and a bottom surface. The leads are formed at regular intervals along and spaced apart from the perimeter to the chip paddle and extend towards the chip paddle.

A chip paddle is provided which has a top surface, a side surface and a bottom surface. The chip paddle is bonded to the bottom surface of the semiconductor chip by an adhesive. The chip paddle has corners, a perimeter and a half-etched section at the lower edge of the chip paddle along the chip paddle perimeter.

A plurality of conductive wires are electrically connected to and located between the plurality of internal leads and the semiconductor chip. Encapsulating material encapsulates the semiconductor chip, conductive wires, chip paddle, and the leads to form a package body. The flow of the encapsulation material is limited by the dam bars formed on the leadframe. The dam bars also serve to stabilize the leads on the leadframe. After encapsulation, the chip paddle, leads, and tie bars are externally exposed at respective side and bottom surfaces. There is provided a heat block which has a pedestal on its upper surface. The pedestal serves to firmly support the half-etched section of the internal leads and maintain the internal leads in a fixed position during the wire bonding process. The heat block serves to protect the semiconductor chip from excessive heat during the wire bonding process.

In another embodiment of the present invention, there is provided a second heat block assembly having a heat block, which has at its bottom surface a groove similar to a raised section formed at an upper surface of a guide block. The groove and raised section meet when the heat block is guided by the guide block. During the wire bonding process, the meeting groove and raised section serves to prevent tilting of the leadframe. The guide block locates the heat block onto a bottom surface of the chip paddle and leads of the leadframe, or, in alternate embodiments, to the semiconductor chip and leads.

In yet another embodiment of the present invention, there is provided a clamp useful for the wire bonding of a semiconductor package that has a notch of a predetermined size therein. The notch allows the position of the first lead to be easily recognized from the leadframe during the wire bonding process.

BRIEF DESCRIPTION OF THE DRAWINGS

A more complete understanding of the method and apparatus of the present invention may be obtained by reference to the following detailed description, with like reference numerals denoting like elements, when taken in conjunction with the accompanying Drawings wherein.

DETAILED DESCRIPTION OF THE INVENTION

Figure 1:
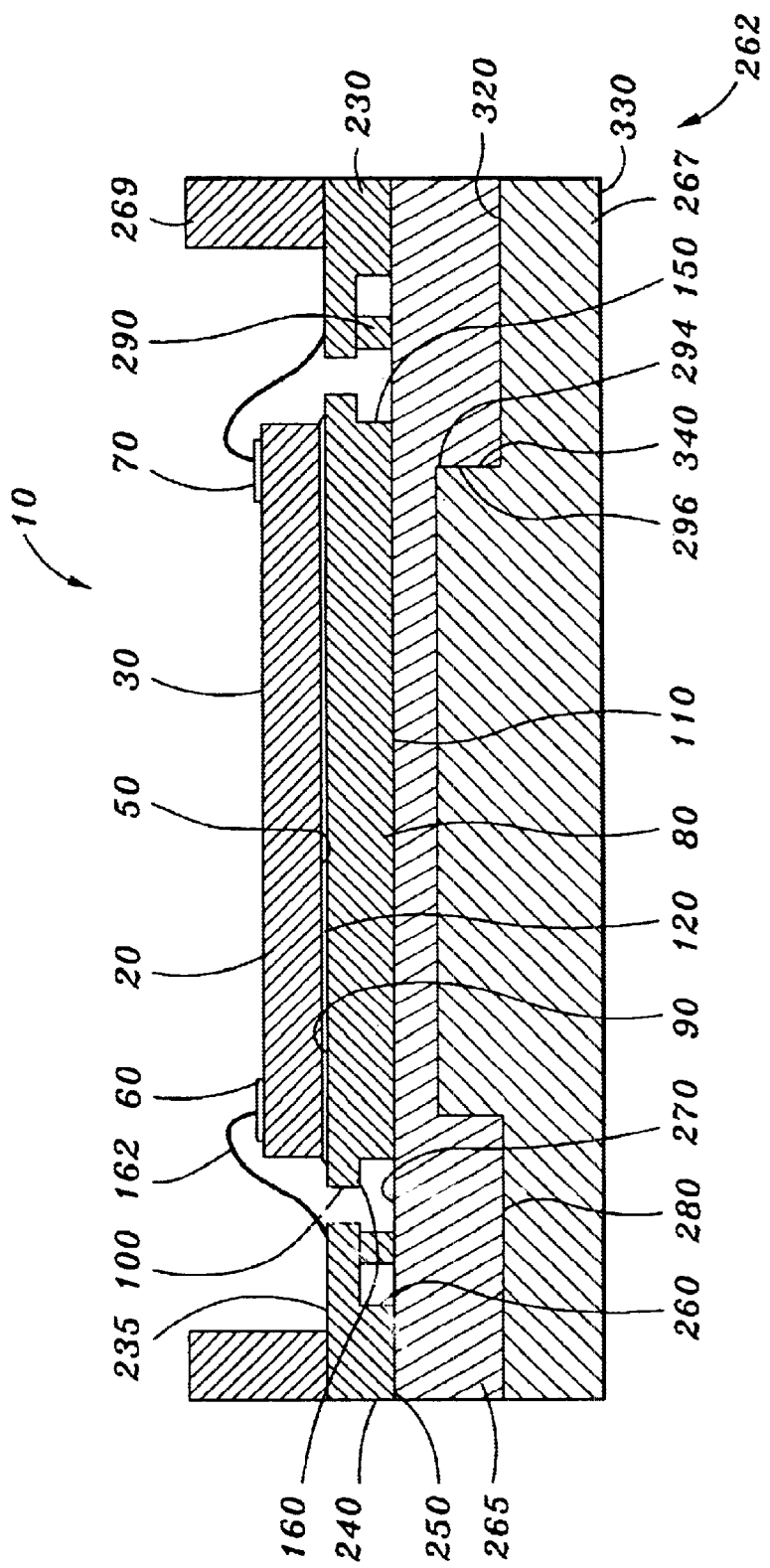
FIG. 1 is a cross-sectional view of a wire bonded semiconductor package according to one embodiment of the invention.

Referring first to FIG. 1, there is shown a cross-sectional illustration of one embodiment of a semiconductor package assembly 10 construed in accordance with the principles of the present invention. The semiconductor package assembly 10 includes a planar or substantially planar semiconductor chip 20 having a planar or substantially planar upper surface 30 and a planar or substantially planar bottom surface 50. A plurality of input bond pads 60 and output bond pads 70, collectively referred to as bond pads in general, are disposed on the upper surface 30 of the semiconductor chip 20. A planar or substantially planar chip paddle 80 having a top surface 90, a side surface 100 and a bottom surface 110 is secured to the bottom surface 50 of the semiconductor chip 20 via an adhesive 120. The chip paddle 80 has corners 130 (FIG. 2), a perimeter and may include a half-etched section 150. The half-etched section 150 is located at a lower edge 160 of the chip paddle 80.

Figure 2:
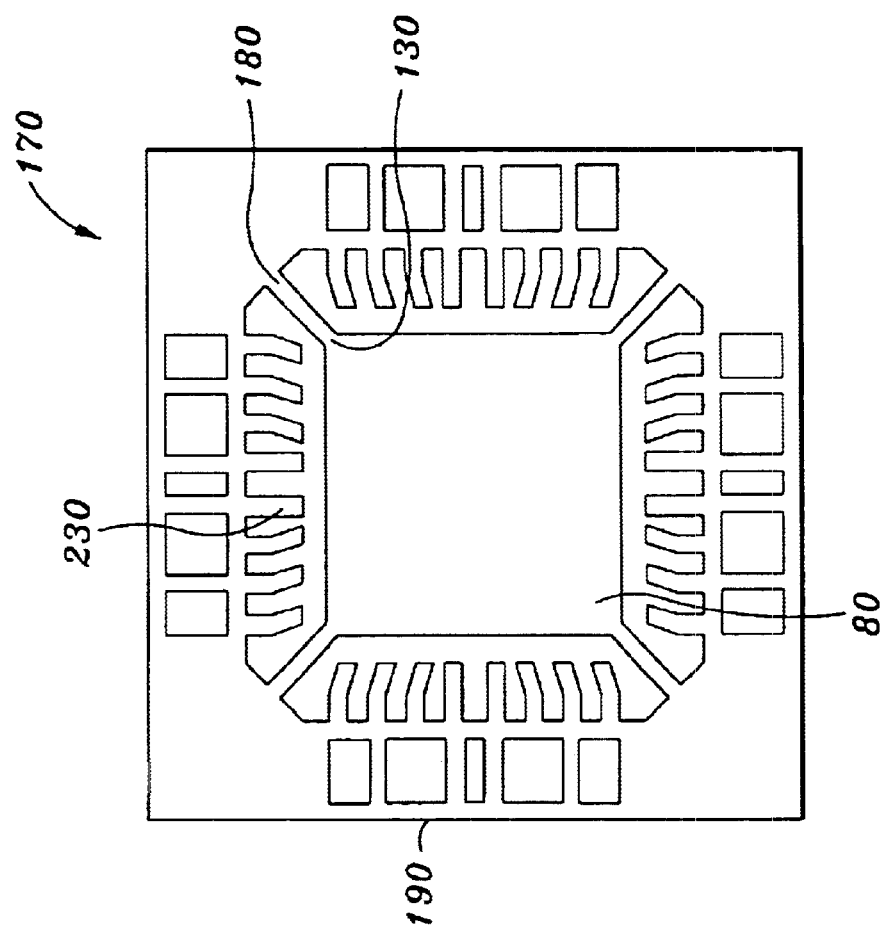
FIG. 2 is a top plan view of a leadframe used to make the semiconductor package of the present invention.

Referring now to FIGS. 1 and 2, a metallic leadframe 170 is shown having a plurality of tie bars 180, a side surface 190 and a bottom surface (not shown). The tie bars 180 are connected to the corners 130 of the chip paddle 80, and externally extend from the chip paddle 80. Although not shown, the leadframe 170 may have a half-etched section to improve the bonding strength of the semiconductor package assembly 10. A plurality of finger-like leads 230 are connected to the leadframe 170, and have an upper surface 235, a side surface 240 and a bottom surface 250. The upper surface 235 may be plated with an electrically conductive and bonding strength enhancing material such as, but not limited to, gold or silver. The leads 230 are formed at regular intervals along the perimeter and spaced apart from the perimeter of the chip paddle 80. The leads 230 extend towards the chip paddle 80, such that each of the plurality of leads 230 has a half-etched section 260 facing the chip paddle 80. Conductive wires 162 are provided during the wire-bonding process for electrically connecting the bond pads 60, 70 of the semiconductor chip 20 to leads 230.

Referring back to FIG. 1, there is shown a semiconductor package assembly 10 according to a first embodiment of the present invention. The semiconductor package assembly 10 is shown having a heat block assembly 262 attached thereto. The heat block assembly includes a heat block 265, a guide block 267, and a clamp 269. The heat block 265 is shown having an upper surface 270, a lower surface 280 and a pedestal 290, and engages the semiconductor package assembly 10 on the bottom surface 110. The guide block 267 has an upper surface 320, a lower surface 330 and a raised portion 340.

The pedestal 290 functions to support the half-etched section 260 of the leads 230 and prevent bending of the leads 230. The pedestal 290 may be formed of any material, but is preferably composed of the same material as heat block 265 for manufacturing convenience. It is preferred that the pedestal 290 is formed at the same height as the half-etched section 260 of the leads 230 while being square-shaped from a plan point of view. When the conductive wires are bonded to the half-etched section 260 of the leads 230, the pedestal 290 serves to prevent the relatively long, half-etched section 260 of the leads 230 from being bent downwardly as a result of the bonding force.

The heat block 265 has a groove 294 adapted to receive a raised portion 296 of the guide block 267. The groove 294 in this embodiment has the same or similar width as the chip paddle 80. The clamp 269 acts against the leadframe 170 in a manner which maintains the bottom surface 250 of each of the leads 230 in firm engagement to the upper surface 270 and pedestal 290 of the heat block 265, and the bottom surface 110 of the chip paddle 80 in firm engagement to the upper surface 270 of the heat block 265. The guide block 267 serves to stably support most of the area of the heat block 265, thereby preventing tilting of the heat block 265 from the leadframe 170. Because the tilting is eliminated, less packages become defective, which translates into a direct increase in the yield of the wire bonding process.

Figure 3:
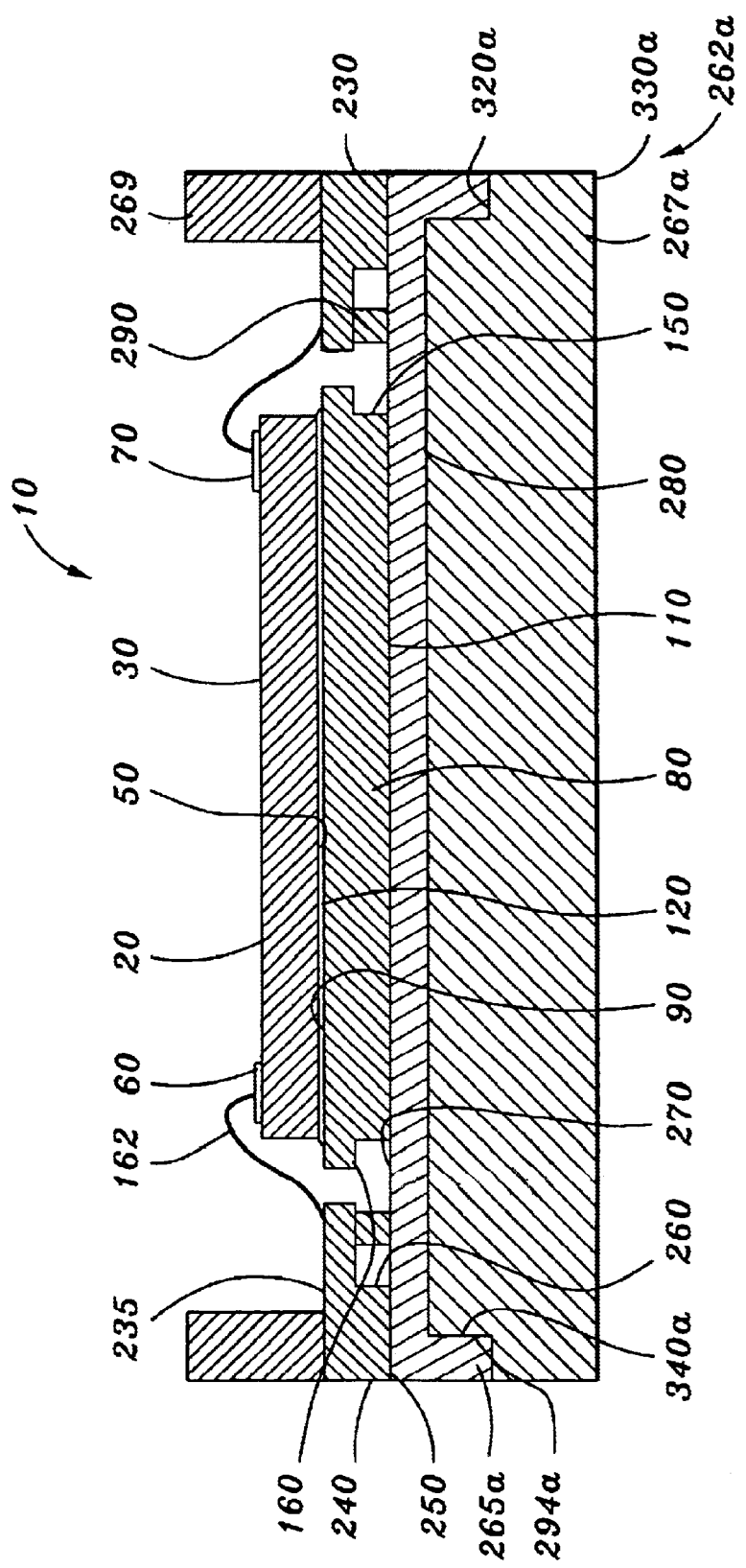
FIG. 3 is a side elevation cross-sectional view showing a wire bonded semiconductor package according to an alternate embodiment of the invention.

Referring now to FIG. 3, there is shown a semiconductor package assembly 10 having a heat block assembly 262*a* attached thereto according to an alternate embodiment of the present invention. In this embodiment, the heat block 265*a* has an upper surface 270 and a lower surface 280, a pedestal 290 and a groove 294*a* in contact with the guide block 267*a*. The heat block assembly 262 engages the semiconductor package assembly 10 on the bottom surface 110. In this embodiment, the groove 294*a* spans almost the entire width of the semiconductor package assembly 10. The guide block 267*a* has an upper surface 320*a*, a lower surface 330*a* and a raised portion 340*a*. The raised portion 340*a* of the guide block 267*a* mates with the groove 294*a* of the heat block 265*a*. The guide block 267*a* serves to stably support most of the area of the heat block 265*a*, thereby preventing tilting of the heat block 265*a* from the leadframe. Because the tilting is eliminated, less packages become defective, which translates into a direct increase in the yield of the wire bonding process.

Figure 4:
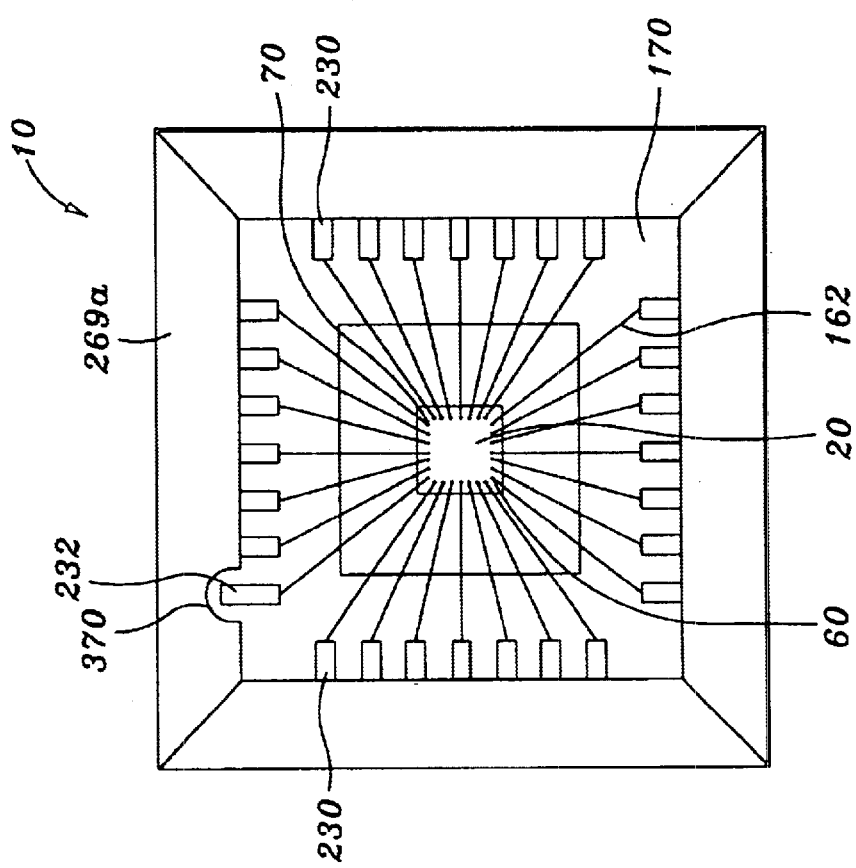
FIG. 4 is a top plan view showing a wire bonded semiconductor package according to another alternate embodiment of the invention.

Referring now to FIG. 4, there is a plan view showing a wire bonded semiconductor package according to another alternate embodiment of the present invention. In this embodiment, the clamp 269*a* has a notch 370 of a predetermined size formed inside the clamp 269*a* which fixes the leads 230 of the leadframe 170 to the heat block 265 (not shown in this Figure). The position of the notch 370 allows easy recognition of the first lead 232 on the leadframe 170 during wire bonding. Typically a predetermined program is used to wire bond the semiconductor package. The readily identifiable location of the first lead 232 in the present invention allows the predetermined program to effectively and efficiently wire bond the semiconductor package assembly 10.

Figure 5:
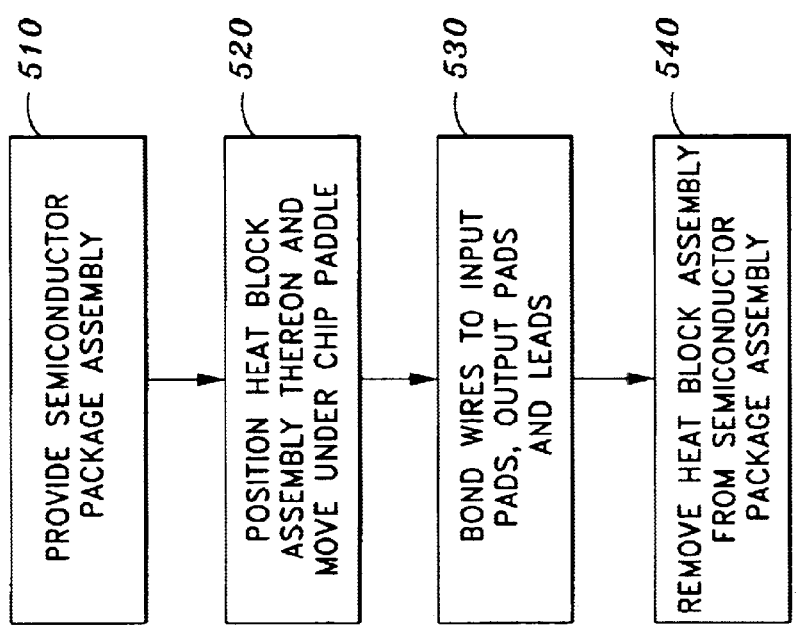
FIG. 5 is a schematic illustration of an exemplary method for wire bonding a semiconductor package according to one embodiment of the invention.

In a process for wire bonding a semiconductor package of the type shown in FIGS. 1 and 3 shown in the flow chart of FIG. 5, a semiconductor package assembly 10 is first provided, indicated by box 510. A heat block assembly 262 comprising the guide block 267 having a heat block 265 positioned thereon is moved under the chip paddle 80 and leads 230 to protect the semiconductor chip 20 from excessive heat during the wire bonding process and secured to the semiconductor package assembly 10 by the clamp 269, indicated by box 520. The clamp 269 may have a notch 370 (FIG. 4) for identification of the first lead 232 in the semiconductor package assembly 10. The heat block 265 has a groove 294 adapted to receive a raised portion 340 of the guide block 267. The heat block 265 further has pedestals 290 to support leads 230 during wire bonding. Wires 162 are then bonded to input and output pads 60, 70 and leads 230 to electrically connect the semiconductor chip 20 to the leads 230, indicated by box 530. The heat block 265 allows heat to travel to the leads 230 and enhance bonding of the wires 162 to the leads 230. Wires 162 are made of conductive material for the electrical connection. After wire bonding, the clamp 269, heat block 265 and guide block 267 are removed from the semiconductor packaged assembly 10, indicated by box 540.

The following applications are all being filed on the same date as the present application and all are incorporated by reference as if wholly rewritten entirely herein, including any additional matter incorporated by reference therein:

| Attorney Docket No. | Title of Application | First Named Inventor |
| --- | --- | --- |
| 45475-00015 | Semiconductor Package Having Increased Solder Joint Strength | Kil Chin Lee |
| 45475-00018 | Near Chip Size Semiconductor Package | Sean Timothy Crowley |
| 45475-00019 | Semiconductor Package | Sean Timothy Crowley |
| 45475-00020 | Stackable Semiconductor Package and Method for Manufacturing Same | Sean Timothy Crowley |
| 45475-00021 | Stackable Semiconductor Package and Method for Manufacturing Same | Jun Young Yang |
| 45475-00024 | Method of and Apparatus for Manufacturing Semiconductor Packages | Hyung Ju Lee |
| 45475-00028 | Semiconductor Package Having Improved Adhesiveness and Ground Bonding | Sung Sik Jang |
| 45475-00029 | Semiconductor Package Leadframe Assembly and Method of Manufacture | Young Suk Chung |

It is thus believed that the operation and construction of the present invention will be apparent from the foregoing description of the preferred exemplary embodiments. While the print coating supply system for a plurality of coating substances shown is described as being preferred, it will be obvious to a person of ordinary skill in the art that various changes and modifications may be made therein without departing from the spirit and the scope of the invention.

What is claimed is:

1. A heat block assembly for use with a semiconductor package assembly having a chip paddle which defines opposed top and bottom surfaces, a plurality of leads which extend at least partially about the chip paddle in spaced relation thereto and each include opposed top and bottom surfaces and a half-etched section of reduced thickness, and a semiconductor chip attached to the top surface of the chip paddle and electrically connected to at least one of the leads, the heat block assembly comprising:

a guide block; and a heat block cooperatively engaged to the guide block, the heat block including a pedestal which is sized and configured to support the half-etched section of each of the leads when the bottom surfaces of the leads and the bottom surface of the chip paddle are placed into abutting contact with the heat block.

2. The heat block assembly of claim 1 further comprising a clamp cooperatively engageable to the top surfaces of the leads for maintaining the bottom surfaces of the leads in abutting contact with the heat block.

3. The heat block assembly of claim 2 wherein:

the guide block defines opposed upper and lower surfaces and a raised portion protruding upwardly from the upper surface; and the heat block defines opposed upper and lower surfaces and a groove which is formed in the lower surface and sized and configured to receive the raised portion of the guide block;

the receipt of the raised portion into the groove facilitating the engagement of the lower surface of the heat block to the upper surface of the guide block, with the pedestal being formed on and the bottom surfaces of the leads and the chip paddle being placeable against the upper surface of the heat block.

4. The semiconductor package of claim 3 wherein:

the chip paddle has a paddle width;

the raised portion of the guide block has a raised portion width;

the groove of the heat block has a groove width; and the raised portion and groove widths do not exceed the chip paddle width.

5. The heat block assembly of claim 2, wherein:

the chip paddle has a paddle width;

the raised portion of the guide block has a raised portion width;

the groove of the heat block has a groove width; and the raised portion and groove widths exceed the chip paddle width.

6. A heat block assembly for use with a semiconductor package assembly having a leadframe which includes a chip paddle defining opposed top and bottom surfaces, and a plurality of leads which extend at least partially about the chip paddle in spaced relation thereto and each include opposed top and bottom surfaces and a half-etched section of reduced thickness, the heat block assembly comprising:

a guide block; and a heat block cooperatively engaged to the guide block, the heat block including a pedestal which is sized and configured to support the half-etched section of each of the leads when the bottom surfaces of the leads and the bottom surface of the chip paddle are placed into abutting contact with the heat block.

7. The heat block assembly of claim 6 further comprising a clamp cooperatively engageable to the leadframe for maintaining the bottom surfaces of the leads and the bottom surface of the chip paddle in abutting contact with the heat block.

8. The heat block assembly of claim 7 wherein the leadframe further comprises a plurality of tie bars integrally connected to and extending from the chip paddle, and the clamp is cooperatively engageable to the top surfaces of the leads and the tie bars to maintain the bottom surfaces of the leads and the bottom surface of the chip paddle in abutting contact with the heat block.

9. The heat block assembly of claim 7 wherein:

the guide block defines opposed upper and lower surfaces and a raised portion protruding upwardly from the upper surface; and the heat block defines opposed upper and lower surfaces and a groove which is formed in the lower surface and sized and configured to receive the raised portion of the guide block;

the receipt of the raised portion into the groove facilitating the engagement of the lower surface of the heat block to the upper surface of the guide block, with the pedestal being formed on and the bottom surfaces of the leads and the chip paddle being placeable against the upper surface of the heat block.

10. The semiconductor package of claim 9 wherein:

the chip paddle has a paddle width;

the raised portion of the guide block has a raised portion width;

the groove of the heat block has a groove width; and the raised portion and groove widths do not exceed the chip paddle width.

11. The heat block assembly of claim 9 wherein:

the chip paddle has a paddle width;

the raised portion of the guide block has a raised portion width;

the groove of the heat block has a groove width; and the raised portion and groove widths exceed the chip paddle width.

\* \* \* \* \*